US011011347B2

(12) United States Patent
Hayashi et al.

(10) Patent No.: US 11,011,347 B2
(45) Date of Patent: May 18, 2021

(54) PLASMA PROCESSING APPARATUS

(71) Applicant: TOKYO ELECTRON LIMITED, Tokyo (JP)

(72) Inventors: Daisuke Hayashi, Miyagi (JP); Kengo Kaneko, Miyagi (JP); Katsuyuki Koizumi, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 225 days.

(21) Appl. No.: 16/012,959

(22) Filed: Jun. 20, 2018

(65) Prior Publication Data

US 2018/0374672 A1 Dec. 27, 2018

(30) Foreign Application Priority Data

Jun. 21, 2017 (JP) .............................. JP2017-121699

(51) Int. Cl.
*H01J 37/24* (2006.01)
*H01L 21/683* (2006.01)
(Continued)

(52) U.S. Cl.
CPC .............. *H01J 37/24* (2013.01); *H01J 37/20* (2013.01); *H01J 37/32577* (2013.01);
(Continued)

(58) Field of Classification Search
CPC ................. H01J 37/24; H01J 37/32908; H01J 37/32577; H01J 37/32724; H01J 37/20;
(Continued)

(56) References Cited

U.S. PATENT DOCUMENTS

2004/0194709 A1* 10/2004 Yamagishi ........ H01J 37/32082
118/723 E
2007/0284344 A1* 12/2007 Todorov ............ H01J 37/32706
219/121.54
(Continued)

FOREIGN PATENT DOCUMENTS

CN          104918400 A      9/2015
JP          2015-97197 A     5/2015
JP          2015-173027      10/2015

*Primary Examiner* — Laura Edwards
(74) *Attorney, Agent, or Firm* — Rothwell, Figg, Ernst & Manbeck, P.C.

(57) ABSTRACT

A plasma processing apparatus includes an external circuit electrically connected through a line to an electrical component in a processing chamber and a filter provided on the line to attenuate or block noise introduced into the line from the electrical component toward the external circuit. The filter includes a coil having constant diameter and coil length; a tubular outer conductor accommodating the coil and forming a distributed constant line in which parallel resonance occurs at multiple frequencies in combination with the coil; and a movable member for changing each winding gap of the coil and provided in an effective section where a specific one or a plurality of parallel resonance frequencies is shifted to a higher frequency side or a lower frequency side in frequency-impedance characteristics of the filter by changing the winding gap of the coil in the effective section in a longitudinal direction of the coil.

12 Claims, 12 Drawing Sheets

(51) Int. Cl.
*H01L 21/67* (2006.01)
*H01J 37/20* (2006.01)
*H01J 37/32* (2006.01)

(52) U.S. Cl.
CPC .. *H01J 37/32724* (2013.01); *H01J 37/32908* (2013.01); *H01L 21/67069* (2013.01); *H01L 21/67103* (2013.01); *H01L 21/67109* (2013.01); *H01L 21/67248* (2013.01); *H01L 21/6831* (2013.01); *H01L 21/6833* (2013.01); *H01J 2237/2001* (2013.01)

(58) Field of Classification Search
CPC ....... H01J 2237/2001; H01L 21/67248; H01L 21/6831; H01L 21/6833; H01L 21/67103; H01L 21/67109; H01L 21/67069; H05H 1/46; H05H 2245/123; C23C 16/4586
USPC .......................................... 156/345.52, 345.27
See application file for complete search history.

(56) References Cited

U.S. PATENT DOCUMENTS

2013/0249399 A1* 9/2013 Chen ................. H01J 37/32577
315/111.21
2015/0262793 A1 9/2015 Okunishi et al.

* cited by examiner

FIG. 6

| TURN NUMBER | STAN-DARD | DENSE 1 | DENSE 2 | DENSE 3 | DENSE 4 | DENSE 5 | DENSE 6 | SPARSE 1 | SPARSE 2 | SPARSE 3 | SPARSE 4 | SPARSE 5 | SPARSE 6 |
|---|---|---|---|---|---|---|---|---|---|---|---|---|---|
| 1 | 11 | 12.5 | 12.5 | 12.5 | 12.5 | 12.5 | 12.5 | 9 | 9 | 9 | 9 | 9 | 9 |
| 2 | 11 | 12.5 | 12.5 | 12.5 | 12.5 | 12.5 | 9 | 9 | 9 | 9 | 9 | 9 | 14.5 |
| 3 | 11 | 12.5 | 12.5 | 12.5 | 9 | 9 | 12.5 | 9 | 9 | 13.5 | 14.5 | 13.5 | 9 |
| 4 | 11 | 12.5 | 12.5 | 9 | 9 | 12.5 | 12.5 | 9 | 9 | 14.5 | 14.5 | 13.5 | 9 |
| 5 | 11 | 12.5 | 9 | 9 | 11.5 | 12.5 | 10 | 9 | 14.5 | 13.5 | 9 | 9 | 14.5 |
| 6 | 11 | 12.5 | 9 | 12.5 | 12.5 | 12.5 | 9 | 9 | 14.5 | 14.5 | 9 | 13.5 | 9 |
| 7 | 11 | 9 | 9 | 12.5 | 12.5 | 9 | 10 | 13.5 | 14.5 | 9 | 9 | 9 | 14.5 |
| 8 | 11 | 9 | 9 | 9 | 12.5 | 12.5 | 12.5 | 13.5 | 14.5 | 9 | 9 | 9 | 9 |
| 9 | 11 | 9 | 11.5 | 9 | 12.5 | 12.5 | 9 | 13.5 | 9 | 9 | 9 | 9 | 9 |
| 10 | 11 | 9 | 12.5 | 12.5 | 12.5 | 9 | 10 | 14.5 | 9 | 13.5 | 9 | 9 | 14.5 |
| 11 | 11 | 9 | 12.5 | 9 | 12.5 | 12.5 | 12.5 | 14.5 | 9 | 14.5 | 9 | 14.5 | 9 |
| 12 | 11 | 9 | 12.5 | 9 | 12.5 | 12.5 | 9 | 14.5 | 9 | 13.5 | 14.5 | 9 | 14.5 |
| 13 | 11 | 9 | 11.5 | 9 | 12.5 | 9 | 10 | 13.5 | 14.5 | 9 | 14.5 | 9 | 9 |
| 14 | 11 | 9 | 9 | 9 | 12.5 | 12.5 | 12.5 | 13.5 | 14.5 | 9 | 9 | 9 | 14.5 |
| 15 | 11 | 9 | 9 | 12.5 | 12.5 | 9 | 9 | 9 | 14.5 | 9 | 14.5 | 9 | 14.5 |
| 16 | 11 | 12.5 | 9 | 12.5 | 12.5 | 9 | 9 | 9 | 9 | 9 | 9 | 13.5 | 9 |
| 17 | 11 | 12.5 | 9 | 9 | 11.5 | 12.5 | 9 | 9 | 9 | 13.5 | 14.5 | 13.5 | 14.5 |
| 18 | 11 | 12.5 | 12.5 | 9 | 9 | 9 | 12.5 | 9 | 9 | 14.5 | 14.5 | 9 | 14.5 |
| 19 | 11 | 12.5 | 12.5 | 9 | 12.5 | 12.5 | 9 | 9 | 9 | 13.5 | 9 | 13.5 | 9 |
| 20 | 11 | 12.5 | 12.5 | 12.5 | 12.5 | 12.5 | 12.5 | 9 | 9 | 9 | 9 | 13.5 | 14.5 |
| 21 | 11 | 12.5 | 12.5 | 12.5 | 12.5 | 12.5 | 12.5 | 9 | 9 | 9 | 9 | 9 | 9 |
| TOTAL LENGTH | 231 | 231 | 233 | 231 | 233 | 231 | 233 | 233 | 233 | 233 | 233 | 231 | 233 |

PLASMA PROCESSING APPARATUS

CROSS-REFERENCE TO RELATED APPLICATIONS

This application claims priority to Japanese Patent Application No. 2017-121699 filed on Jun. 21, 2017, the entire contents of which are incorporated herein by reference.

FIELD OF THE INVENTION

The present disclosure relates to a plasma processing apparatus.

BACKGROUND OF THE INVENTION

Conventionally, there is known a plasma processing apparatus for performing plasma processing such as etching or the like on a target substrate such as a semiconductor wafer or the like by using plasma. This plasma processing apparatus has a temperature control function for controlling a target substrate to a predetermined temperature by transferring heat to a mounting table on which the target substrate is mounted. In order to realize the temperature control function, there is used a heater for controlling Joule heat generated by a heating element provided in the mounting table.

However, when the plasma processing apparatus employs the heater system, a part of the high frequency power, which is applied from the high frequency power supply to the mounting table to generate plasma, flows as noise into a heater power supply line through the heating element.

Therefore, the present applicant has proposed in Japanese Patent Application Publication No. 2015-173027, a technique for providing a filter for attenuating or blocking noise of a high frequency on the heater power supply line. This filter includes an air core coil, a cylindrical outer conductor accommodating therein or surrounding the air core coil, and insulating comb-shaped members selectively inserted into winding gaps of the air core coil. In the air core coil of the filter, there is an effective section for shifting a specific one or a plurality of parallel resonance frequencies in frequency-impedance characteristics by changing the winding gap. In the filter, the comb-shaped members of the winding gap are inserted into the effective section of the air core coil so that a parallel resonance frequency corresponding to the frequency of the noise to be blocked can be obtained.

However, the frequency of the noise varies depending on the type of the plasma processing apparatus or the frequency of high frequency power applied to the mounting table. Therefore, in the technique disclosed in Japanese Patent Application Publication No. 2015-173027, it is necessary to reconstruct a filter having different winding gap widths in order to obtain different parallel resonance frequencies corresponding to different frequencies of the noise.

SUMMARY OF THE INVENTION

In view of the above, the present disclosure provides a plasma processing apparatus including a filter that can reduce burden of reconstructing a filter for different frequencies of noise.

In accordance with an aspect, there is provided a plasma processing apparatus including an external circuit of a signal system or a power system electrically connected through a line to an electrical component in a processing chamber where plasma processing is performed and a filter provided on the line to attenuate or block noise introduced into the line from the electrical component toward the external circuit, wherein the filter includes: a coil having a constant diameter and a constant coil length; a tubular outer conductor accommodating or surrounding the coil and forming a distributed constant line in which parallel resonance occurs at multiple frequencies in combination with the coil; and a movable member configured to change each winding gap of the coil and provided in one or a plurality of effective sections where a specific one or a plurality of parallel resonance frequencies is shifted to a higher frequency side or a lower frequency side in frequency-impedance characteristics of the filter by changing the winding gap of the coil in the effective section in a longitudinal direction of the coil.

BRIEF DESCRIPTION OF THE DRAWINGS

The objects and features of the present disclosure will become apparent from the following description of embodiments, given in conjunction with the accompanying drawings, in which:

FIG. 6 shows an example of a pattern of a winding gap;

DETAILED DESCRIPTION OF THE EMBODIMENTS

Figure 1:
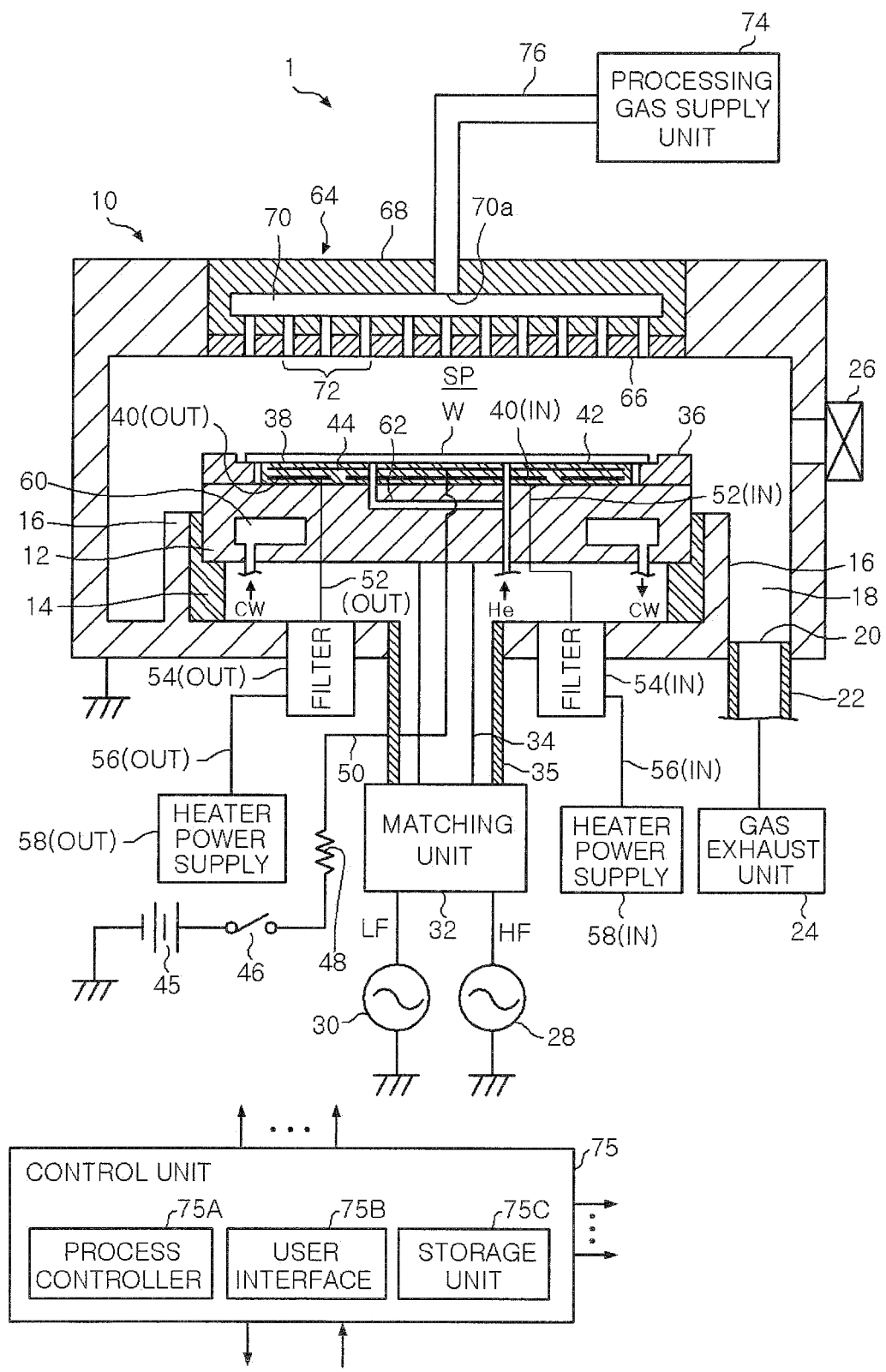
FIG. 1 shows an example of a configuration of a plasma processing apparatus.

Hereinafter, embodiments of a plasma processing apparatus of the present disclosure will be described in detail with reference to the accompanying drawings. Like reference numerals will be given to like or corresponding parts throughout the drawings. The embodiments are not intended to limit the present disclosure. The embodiments can be appropriately combined without contradicting processing contents.

Overall Configuration of Plasma Processing Apparatus

FIG. 1 shows an example of a configuration of a plasma processing apparatus. A plasma processing apparatus 1 according to an embodiment is configured as a capacitively coupled plasma etching apparatus of a lower side dual frequency application type. The plasma processing apparatus 1 includes a cylindrical chamber (processing chamber) 10 made of metal such as aluminum, stainless steel, or the like. The chamber 10 is grounded.

A disc-shaped susceptor 12 for mounting thereon a target substrate, e.g., a semiconductor wafer W, is horizontally provided in the chamber 10 and serves as a lower electrode. The susceptor 12 is made of, e.g., aluminum, and is supported without being grounded by an insulating cylindrical support 14 which is made of, e.g., ceramic and extends vertically upward from a bottom portion of the chamber 10. In the chamber 10, an annular gas exhaust passageway 18 is formed between an inner surface of a sidewall of the chamber 10 and a conductive cylindrical supporting portion 16 extending vertically upward from the bottom portion of the chamber 10 along an outer periphery of the insulating cylindrical support 14. A gas exhaust port 20 is provided at a bottom of the gas exhaust passageway 18. A gas exhaust unit 24 is connected to the gas exhaust port 20 through a gas exhaust line 22. The gas exhaust unit 24 includes a vacuum pump such as a turbo molecular pump or the like and, thus, a pressure in a processing space in the chamber 10 can be decreased to a predetermined vacuum level. A gate valve 26 for opening and closing a loading/unloading port for the semiconductor wafer W is formed on the sidewall of the chamber 10.

A first and a second high frequency power supply 28 and 30 are electrically connected to the susceptor 12 through a matching unit 32 and a power supply rod 34. The power and the frequency of the high frequency power supplied by the first and the second high frequency power supply 28 and 30 can be changed under the control of a control unit 75 to be described later. Here, the first high frequency power supply 28 mainly outputs a first high frequency power HF having a predetermined frequency (generally 27 MHz or more, preferably 60 MHz or more) which contributes to generation of plasma. On the other hand, the second high frequency power supply 30 mainly outputs a second high frequency power LF having a predetermined frequency (generally 13 MHz or less) which contributes to attraction of ions to the semiconductor wafer W on the susceptor 12. A matching circuit for matching an impedance between the first and the second high frequency power supply 28 and 30 and a plasma load is accommodated in the matching unit 32.

The power supply rod 34 is a cylindrical or a columnar conductor having a predetermined outer diameter. An upper end thereof is connected to a central portion of a bottom surface of the susceptor 12, and a lower end thereof is connected to the matching unit 32. A cylindrical conductor cover 35 surrounding the power supply rod 34 is provided between the bottom surface of the chamber 10 and the matching unit 32.

The susceptor 12 has a diameter greater than that of the semiconductor wafer W. An upper surface of the susceptor 12 is partitioned into a wafer mounting portion having substantially the same shape (circular shape) and substantially the same size as those of the wafer W and an annular peripheral portion extending around the wafer mounting portion. The semiconductor wafer W as a processing target is mounted on the wafer mounting portion of the susceptor 12. An annular focus ring 36 having an inner diameter greater than the diameter of the semiconductor wafer W is provided on the annular peripheral portion. The focus ring 36 is made of, e.g., any one of Si, SiC, C and $SiO_2$, depending on an etching target material of the semiconductor wafer W.

An electrostatic chuck 38 for attracting the wafer and a heating element 40 are provided on the wafer mounting portion on the upper surface of the susceptor 12. In the electrostatic chuck 38, a DC electrode 44 is embedded in a film-shaped or plate-shaped dielectric member 42 integrally formed or integrally fixed to the upper surface of the susceptor 12. An external DC power supply 45 provided outside the chamber 10 is electrically connected to the DC electrode 44 through a switch 46, a high-resistance resistor 48 and a DC high voltage line 50. The semiconductor wafer W is attracted and held on the electrostatic chuck 38 by an electrostatic force generated by applying a high DC voltage from the DC power supply 45 to the DC electrode 44. The DC high voltage line 50 is a coated line that is connected to the DC electrode 44 of the electrostatic chuck 38 through the cylindrical power supply rod 34 and the susceptor 12.

Figure 2:
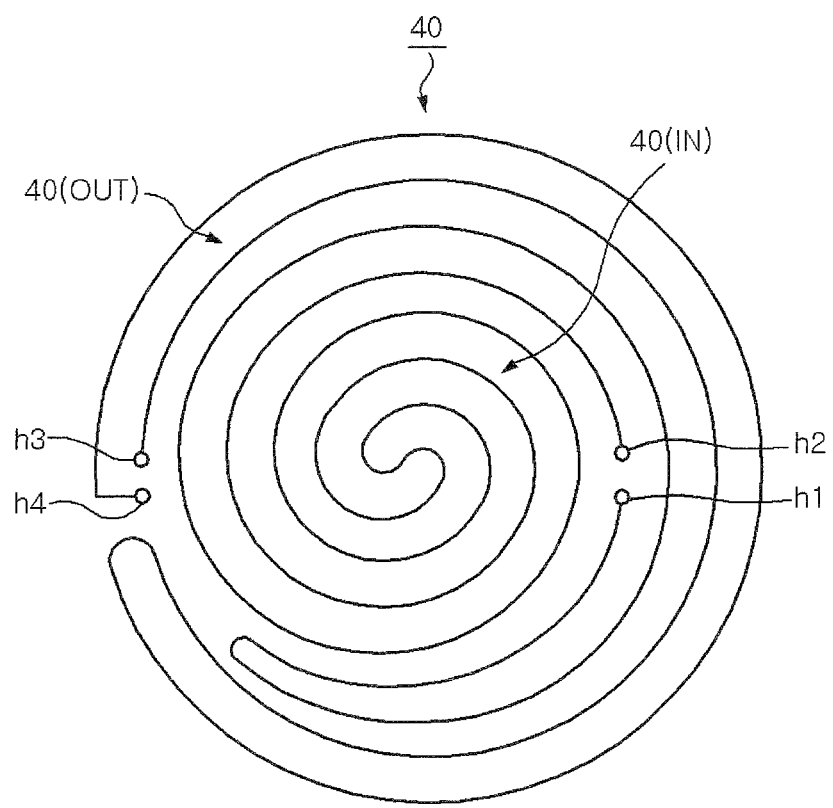
FIG. 2 shows an example of a configuration of a heating element.

The heating element 40 includes, e.g., a spiral-shaped resistance heating wire embedded in the dielectric member 42 together with the DC electrode 44 of the electrostatic chuck 38. FIG. 2 shows an example of a configuration of the heating element. In the present embodiment, the heating element 40 is divided into two parts, i.e., an inner heating wire 40(IN) and an outer heating wire 40(OUT) in a radial direction of the susceptor 12. The inner heating wire 40(IN) is electrically connected to a dedicated heater power supply 58(IN) that is provided outside the chamber 10 through an insulation-coated power feed conductor 52(IN), a filter unit 54(IN) and an electric cable 56(IN). The outer heating wire 40(OUT) is electrically connected to a dedicated heater power supply 58(OUT) provided outside the chamber 10 through an insulation-coated power feed conductor 52(OUT), a filter unit 54(OUT) and an electric cable 56(OUT). The filter units 54(IN) and 54(OUT) are main features of the present embodiment. The internal configurations and the operations thereof will be described in detail later.

An annular coolant passageway 60 extending in, e.g., a circumferential direction, is provided in the susceptor 12. A coolant, e.g., cooling water cw, of a predetermined temperature is supplied from a chiller unit (not shown) and circulated in the coolant passageway 60 through a coolant supply line. The plasma processing apparatus 1 is configured to control a temperature of the susceptor 12 to be decreased through a temperature of the coolant. In the plasma processing apparatus 1, a heat transfer gas, e.g., He gas, is supplied from a heat transfer gas supply unit (not shown) to a contact interface between the electrostatic chuck 38 and the semiconductor wafer W through a gas supply line and a gas passageway 62 in the susceptor 12 in order to thermally couple the semiconductor wafer W to the susceptor 12.

A shower head 64 serving as an upper electrode is provided at a ceiling of the chamber 10. The shower head 64 faces the susceptor 12 in parallel therewith. The shower head 64 includes an electrode plate 66 facing the susceptor and an electrode holder 68 detachably holding the electrode plate 66 at the upper side thereof. A gas diffusion space 70 is provided in the electrode holder 68. A plurality of gas injection holes 72 extending from the gas diffusion space 70 toward the susceptor 12 is formed in the electrode plate 66 and the electrode holder 68. A space SP between the electrode plate 66 and the susceptor 12 serves as a plasma generation space or a processing space. A gas supply line 76 from a processing gas supply unit 74 is connected to a gas inlet port 70a provided at an upper portion of the gas diffusion space 70. The electrode plate 66 is made of, e.g., Si, SiC or C. The electrode holder 68 is made of, e.g., alumite-treated aluminum.

The operation of the plasma processing apparatus 1 configured as described above is integrally controlled by the control unit 75. The control unit 75 is, e.g., a computer, and controls the respective components of the plasma processing apparatus 1. For example, the control unit 75 controls the gas exhaust unit 24, the high frequency power supplies 28 and 30, the switch 46 of the DC power supply 45, the heater power supplies 58(IN) and 58(OUT), the chiller unit (not shown), the heat transfer gas supply unit (not shown), the processing gas supply unit 74, and the like. The control unit 75 includes a process controller 75A having a CPU and configured to control the respective components of the plasma processing apparatus 1, a user interface 75B, and a storage unit 75C.

The user interface 75B includes a keyboard through which a process manager inputs commands to manage the plasma processing apparatus 1, a display for visualizing an operation state of the plasma processing apparatus 1, and the like.

The storage unit 75C stores therein recipes including a control program (software), processing condition data and the like for realizing various processes performed by the plasma processing apparatus 1 under the control of the process controller 75A. The recipes including the control program, the processing condition data and the like can be stored in a computer-readable storage medium (e.g., a hard disk, a CD, a flexible disk, a semiconductor memory, or the like) or can be transmitted, when needed, from another apparatus through, e.g., a dedicated line, and used on-line.

The process controller 75A reads out and executes the control program stored in the storage unit 75C, thereby executing a desired process in the plasma processing apparatus 1. For example, the process controller 75A retrieves the recipe from the storage unit 75C and executes plasma processing based on the recipe, thereby performing etching.

In the plasma processing apparatus 1, in the case of performing etching, first, the gate valve 26 is opened and, then, the semiconductor wafer W as a processing target is loaded into the chamber 10 and mounted on the electrostatic chuck 38. Next, in the plasma processing apparatus 1, an etching gas (generally, a mixed gas) is introduced at a predetermined flow rate into the chamber 10 from the processing gas supply unit 74, and a pressure in the chamber 10 is set to a set value by the gas exhaust unit 24. Then, in the plasma processing apparatus 1, the first and the second high frequency power supplies 28 and 30 are switched on to output the first high frequency HF and the second high frequency LF at predetermined power levels. These high frequency powers HF and LF are applied to the susceptor (lower electrode) 12 through the matching unit 32 and the power supply rod 34. In the plasma processing apparatus 1, a heat transfer gas (He gas) is supplied from the heat transfer gas supply unit to the contact interface between the electrostatic chuck 38 and the semiconductor wafer W, and the switch 46 for the electrostatic chuck is switched on to confine the heat transfer gas in the contact interface by the electrostatic attraction force. In the plasma processing apparatus 1, the heater power supplies 58(IN) and 58(OUT) are switched on to heat the inner heating wiring 40(IN) and the outer heating wiring 40(OUT) by independent Joule heat, thereby controlling a temperature or temperature distribution of the upper surface of the susceptor 12 to a set value. In the plasma processing apparatus 1, the etching gas injected from the shower head 64 is converted into plasma by high frequency discharge between the susceptor 12 functioning as a lower electrode and the shower head 64 functioning as an upper electrode. A processing target film on the surface of the semiconductor wafer W is etched into a desired pattern by radicals and ions in the plasma thus generated.

In the plasma processing apparatus 1, during the plasma etching, a part of the first high frequency power HF and the second high frequency power LF applied from the high frequency power supplies 28 and 30 to the susceptor 12 is inputted as a noise of the high frequency into the power feed conductors 52(IN) and 52(OUT) through the inner heating wire 40(IN) and the outer heating wire 40(OUT) embedded in the susceptor 12. When any noise of the frequencies of the two high frequency powers is inputted into the heater power supplies 58(IN) and 58(OUT), the operation or the performance of the heater power supplies 58(IN) and 58(OUT) may deteriorate.

In this regard, in the plasma processing apparatus 1, filter units 54(IN) and 54(OUT) are provided on a heater power supply line that electrically connects the heater power supplies 58(IN) and 58(OUT) and the inner heating wire 40(IN) and the outer heating wire 40(OUT). As will be described in detail later, these filter units 54(IN) and 54(OUT) efficiently and stably realize a filter blocking function with a sufficiently high impedance against any noise of the first and the second frequency power HF and LF, which are introduced into the heater power feed line from the inner and the outer heating wire 40(IN) and 40(OUT), at low power consumption. Accordingly, in the plasma etching apparatus of the present embodiment, a wafer temperature control function using a heater is improved, and leakage of the first and the second high frequency power LF and HF from the chamber 10 into the heater power feed line through the heating element 40 in the susceptor 12 is effectively suppressed or reduced. Thus, reproducibility and reliability of the plasma processing can be improved.

Circuit Configuration in the Filter Unit

Figure 3:
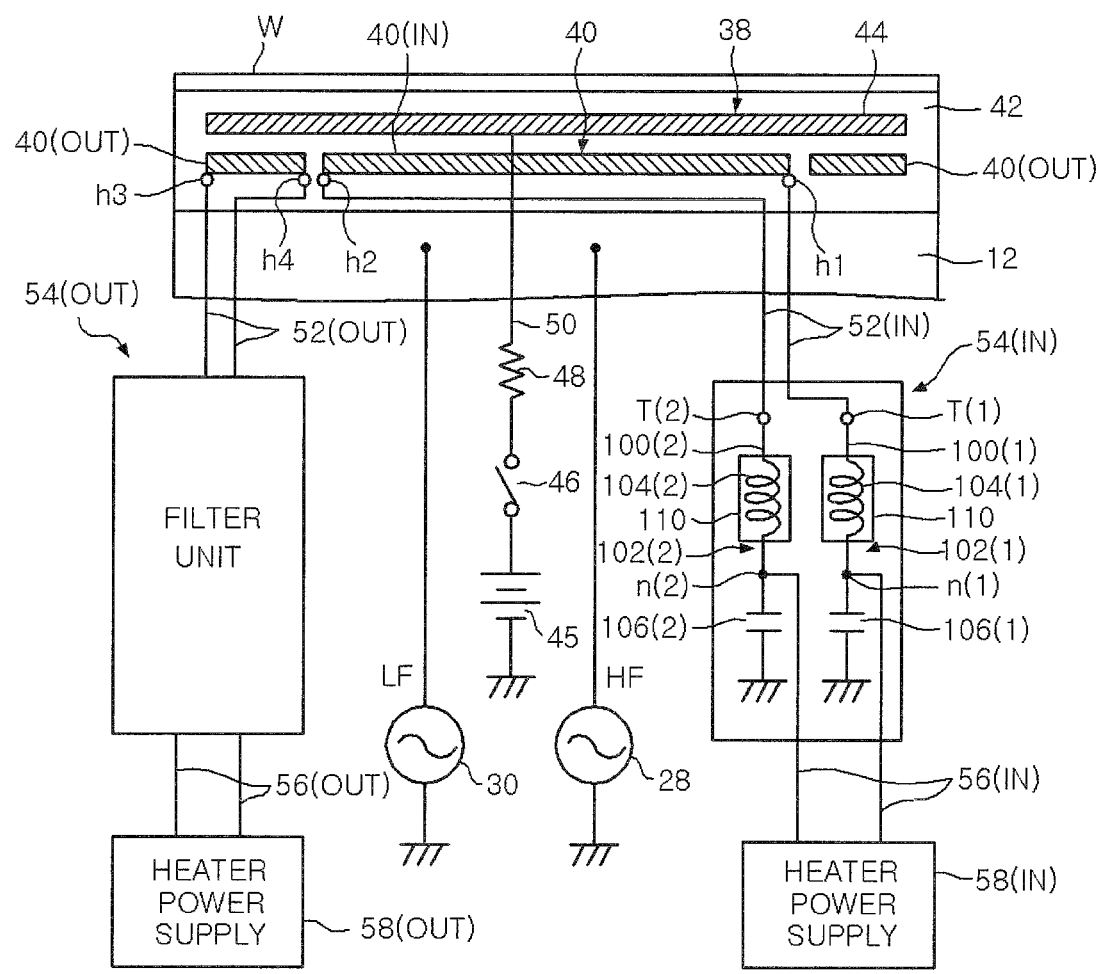
FIG. 3 show an example of a circuit configuration for supplying a power to a susceptor.

Next, a circuit configuration in the filter units 54(IN) and 54(OUT) will be described. FIG. 3 shows an example of the circuit configuration for supplying power to the susceptor. FIG. 3 shows a schematic circuit configuration of a heater power supply unit for supplying power to the heating element 40 provided in the susceptor 12. In the present embodiment, individual heater power supply units having substantially the same circuit configuration are connected to the inner heating wire 40(IN) and the outer heating wire 40(OUT) of the heating element 40, respectively, and heat generation amounts or the heat generation temperatures of the inner heating wire 40(IN) and the outer heating wire 40(OUT) are independently controlled. Since the heater power supply units for the outer heating wire 40(OUT) and the inner heating wire 40(IN) have substantially the same circuit configuration, the configuration and the operation of the heater power supply for the inner heating wire 40(IN) will be described in the following description. The configuration and the operation of the heater power supply unit for the outer heating wire 40(OUT) are the same as those of the heater power supply unit for the outer heating wire 40(IN).

The heater power supply 58(IN) is an AC output type power supply for performing a switching (ON/OFF) operation of a commercial frequency using, e.g., SSR. The heater power supply 58(IN) is connected to the inner heating element 40(IN) by a closed loop circuit. More specifically, between a pair of output terminals of the heater power supply 58(IN), a first output terminal is electrically connected to a first terminal h1 of the inner heating wire 40(IN) through a first power feed line (power supply line) 100(1), and a second output terminal is electrically connected to a second terminal h2 of the inner heating wire 40(IN) through a second power feed line (power supply line) 100(2).

The filter unit 54(IN) has a plurality of filters 102. For example, in the filter unit 54(IN), a filter 102(1) is provided in the first power feed line 100(1) and a filter 102(2) is provided in the second power feed line 100(2). The filters 102(1) and 102(2) have substantially the same configuration.

More specifically, the filters 102(1) and 102(2) have air core coils 104(1) and 104(2) that are grounded via capacitors 106(1) and 106(2), respectively. One terminals or filter terminals T(1) and T(2) of the air core coils 104(1) and 104(2) are respectively connected to both terminals h1 and h2 of the inner heating wire 40(IN) through a pair of power supply conductors 52(IN), and capacitors 106(1) and 106(2) are connected between the other terminals of the air core coils 104(1) and 104(2) and a conductive member of a ground potential (e.g., the chamber 10), respectively. Connection points n(1) and n(2) between the air core coils 104(1) and 104(2) and the capacitors 106(1) and 106(2) are connected to the first and the second output terminal of the heater power supply 58(IN) through electric cables (pair cables) 56(IN), respectively.

In the heater power supply unit configured as described above, during a positive (+) cycle, a current outputted from the heater power supply 58(IN) flows from one terminal h1 to the inner heating wire 40(IN) through the first power feed line 100(1), i.e., through the electric cable 56(IN), the air core coil 104(1) and the power supply conductor 52(IN), so that Joule heat is generated at each portion of the inner heating wire 40(IN). Then, the current returns from the other terminal h2 through the second power feed line 100(2), i.e., the power supply conductor 52(IN), the air core coil 104(2), and the electrical cable 56(IN). During a negative (−) cycle, the current flows through the same circuit in a reverse direction. Since the current of the heater AC output has a commercial frequency, impedances of the air core coils 104(1) and 104(2) or voltage drops thereof are negligibly small and the amount of a leakage current to the earth through the capacitors 106(1) and 106(2) is negligibly small.

In the filter unit 54(IN), the air core coil 104(1) of the filter 102(1) and the air core coil 104(2) of the filter 102(2) are provided in parallel. The air core coils 104(1) and 104(2) have a constant diameter and a constant coil length. For example, the air core coils 104(1) and 104(2) are solenoid coils having no iron core in which an electric wire or a coil conductor is wound in a cylindrical shape, so that the air core coils 104(1) and 104(2) have a thick coil wire or coil conductor and a large coil size (e.g., a diameter of 22 mm to 45 mm and a length of 130 mm to 280 mm) to obtain a large line length and a considerably large inductance with an air core without a magnetic core such as ferrite or the like for the purpose of suppressing heat generation (power loss) in addition to a function of a power feed line through which a sufficiently large current (e.g., about 30 A) flows into the inner heating wire 40(IN) from the heater power supply 58(IN). The air core coils 104(1) and 104(2) are accommodated individually in the outer conductor 110. The filters 102(1) and 102(2) are configured to change the winding gaps of the air core coils 104(1) and 104(2), respectively. The filters 102(1) and 102(2) have substantially the same configuration. Therefore, the configuration and the operation of the air core coil 104(1) will be described in the following. The configuration and the operation of the air core coil 104(2) are the same as those of the air core coil 104(1).

Figure 4:
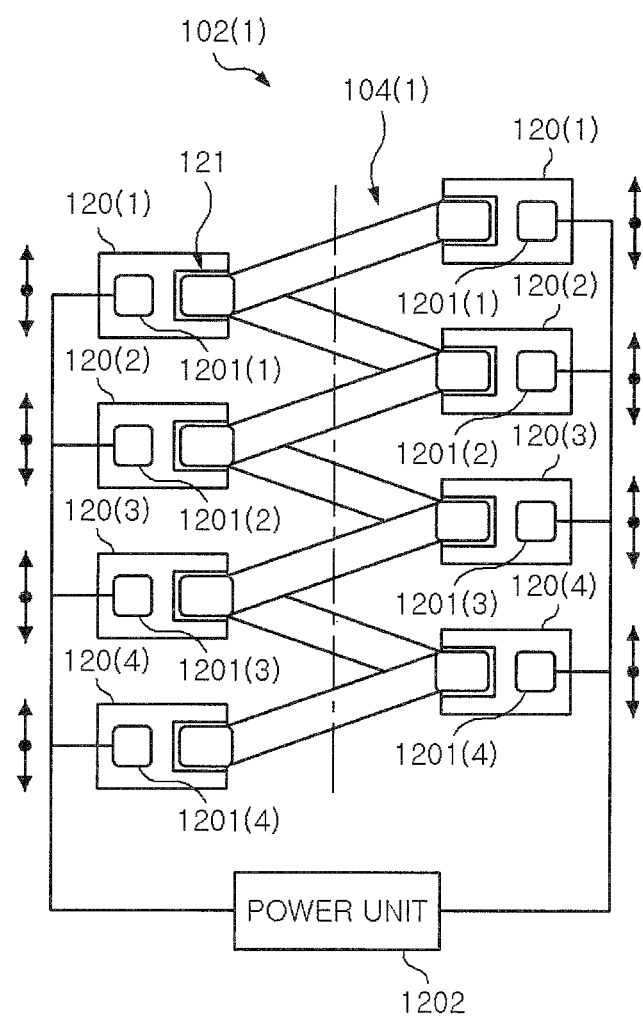
FIG. 4 shows an example of a schematic configuration of an air core coil.

FIG. 4 shows an example of a schematic configuration of the air core coil. In FIG. 4, the air core coil 104(1) of the filter 102(1) is wound four times. The number of windings of the air core coil 104(1) is not limited to four.

In the air core coil 104(1), a plurality of movable members 120 is provided for each turn of the coil winding. In the air core coil 104(1) according to an embodiment, two movable members 120 are provided for each turn of the coil winding. In FIG. 4, a numeral value indicating the number of turns is appended to the reference numeral of each movable member 120 provided for each turn of the coil winding. For example, the movable member 120(1) is a movable member member 120 provided for the first turn of the coil winding. The movable member 120 is preferably made of an insulating material to suppress self-heating caused by the high frequency and the electric field disturbance around the air core coil 104(1). As for the insulating material that can be used for the movable member 120, it is possible to use, e.g., resin, ceramic, glass or the like.

In the movable member 120, a recess 121 corresponding to a thickness of the winding is formed at the air core coil 104(1) side, and the winding of the air core coil 104(1) is fitted into the recess 121. The movable members 120 are individually movable with respect to the axial direction of the air core coil 104(1). The movable member 120 is provided with a power transmission unit 1201 for transmitting power. The power transmission unit 1201 is preferably made of a material having a low linear expansion coefficient. For example, the power transmission unit 1201 is made of a ceramic-based material or a glass-based material. The power transmission unit 1201 is connected to a power unit 1202 such as a motor or the like through a linear motion mechanism that moves in the axial direction of the air core coil 104(1) and moved in the axial direction by the power of the power unit 1202. The power unit 1202 is configured to move the movable member and detect a position of the movable member. For example, the power unit 1202 may be a stepping motor or a servo motor. The power unit 1202 is rotated by an angle determined by the process controller 75A and feedbacks the rotation angle to the process controller 75A. The process controller 75A detects the position of the movable member based on the feedback of the rotation angle of the motor.

In the filter 102(1), the winding gap of the air core coil 104(1) can be changed by moving each movable member 120 under the control of the process controller 75A.

Figure 5:
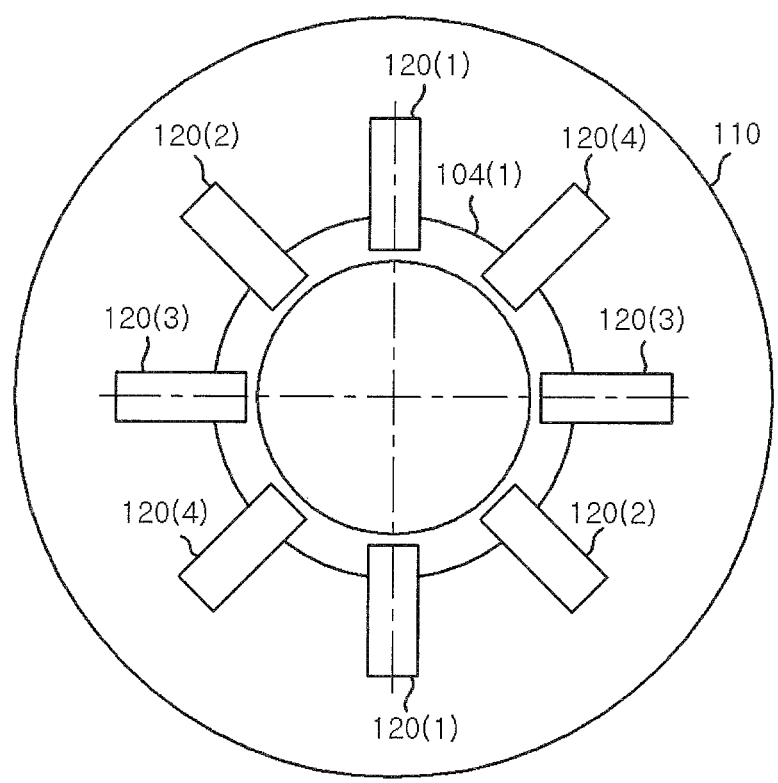
FIG. 5 shows an example of a schematic configuration of the air core coil seen from the top.

FIG. 5 shows an example of a schematic configuration of the air core coil seen from the top. In the air core coil 104(1), two movable members 120 spaced apart from each other at an angle of 180° in the circumferential direction of the winding are provided for each turn of the coil winding. Further, the two movable members 120 are provided for each turn of the winding of the air core coil 104(1) at different positions in the circumferential direction of the winding with respect to the adjacent turns of the winding. In the example of FIG. 5, the movable members 120(1), the movable members 120(2), the movable members 120(3) and the movable members 120(4) are respectively spaced apart from each other at an angle of 180°. Further, the movable members 120(1) to 120(4) are arranged at different positions in the circumferential position at an angle of 45°.

In the example of FIG. 5, the arrangement of the first to the fourth turn has been illustrated. However, the same arrangement is repeated for the fifth and subsequent turns. For example, the movable member 120 of the fifth turn is disposed at the same arrangement position as that of the movable member 120 of the first turn. FIGS. 4 and 5 show the case where two movable members 120 are spaced apart from each other at an angle of 180° in the circumferential direction of the winding for each turn of the air core coil 104(1). However, the number of the movable members 120 for each turn and the angle difference are not limited to the above. For example, three movable members 120 may be spaced apart from each other at an angle of 120° in the circumferential direction of the winding for each turn of the air core coil 104(1).

An outer conductor 110 is provided around the air-core coil 104(1). The outer conductor 110 is made of, e.g., aluminum, and has a cylindrical shape. The air-core coil 104(1) is accommodated coaxially in the outer conductor 110. The outer conductor 110 forms a distributed constant line in which parallel resonance occurs at multiple frequencies in combination with the air core coil 104(1).

Generally, a characteristic impedance Zo of a transmission line is expressed as Zo=√(L/C) by using a capacitance C per unit length and an inductance L when there is no loss. A wavelength λ is calculated by the following equation (1).

$$\lambda = 2\varnothing/\omega\sqrt{)LC)} \qquad \text{Eq. (1)}$$

In a distributed constant line (particularly, coaxial line), a rod-shaped cylindrical conductor serves as the center of the line. However, in the filter unit 54(IN), a cylindrical air core coil serves as a center conductor. The inductance L per unit length is mainly caused by the cylindrical coil. On the other hand, the electrostatic capacitance per unit length is defined as the electrostatic capacitance C of the capacitor formed by the coil surface and the outer conductor. Therefore, in this filter unit 54(IN) as well, on the assumption that the inductance per unit length and the capacitance are respectively set to L and C, a distributed constant line of which the characteristic impedance Zo is expressed as Zo=√(L/C) is formed.

When the filter unit having the distributed constant line is viewed from the terminal T side, the opposite side thereof is quasi short-circuited by a capacitor having a large capacitance (e.g., 5000 pF) and, thus, frequency-impedance characteristics in which a large impedance is repeated at a constant frequency interval are obtained.

Such impedance characteristics are obtained when the wavelength and the distribution line length are equal to each other.

In this filter unit 54(IN), not the coil length of the air core coils 104(1) and 104(2) but the coil length in the axial direction becomes the length of the distributed line. By using the air core coils 104(1) and 104(2) as the central conductor, L can become considerably greater than that in the case of the rod-shaped cylindrical conductor as the central conductor and, thus, A can be reduced. Accordingly, it is possible to realize an effective length that is a relatively short line length (coil length) and equal to or greater than the wavelength, and also possible to obtain the impedance characteristic in which a large impedance is repeated at a relatively short frequency interval.

As disclosed in Japanese Patent Application Publication No. 2015-173027, in the filter unit 54(IN), the parallel resonance frequency corresponding to the peak can be shifted in the frequency-impedance characteristics by changing the winding gap of the air core coil 104(1). Further, the air core coil 104(1) has an effective section for shifting a specific one or a plurality of parallel resonance frequencies corresponding to the peak in the frequency-impedance characteristics.

The changes in the parallel resonance frequency which are caused by changing the winding gap will be described. FIG. 6 shows an example of a pattern of the winding gap. It is assumed that the air core coil 104(1) of the filter 102(1) has 22 turns and a gap between the windings (winding gap) can be individually changed. In "Turn number" of FIG. 6, a position of a coil is expressed as the number of turns. In FIG. 6, a gap between the windings of each pattern is made to correspond to the turn number of the winding having a smaller number of turns between two coils corresponding to both ends of the gap. For example, the turn number "1" indicates a gap between the winding of the first turn and the winding of the second turn. The turn number "21" indicates a gap between the winding of the 21st turn and the winding of the 22nd turn. "Total length" indicates the length of the coil in the axial direction of the air core coil 104(1). In addition, FIG. 6 shows patterns "standard", "dense 1" to "dense 6", and "sparse 1" to "sparse 6" in which the winding gap varies. "Standard" indicates a standard gap between the windings. In the example of FIG. 6, the case in which a gap between 22 turns of the air core coil 104(1) is 11 mm is set to the standard. In "standard", the length of the coil is 231 mm. "Dense 1" to "Dense 6" and "Sparse 1" to "Sparse 6" indicate cases in which the gap between a part or all of the windings varies.

For example, in the case of "dense 1", the gap between the windings having the turn numbers "1" to "6" and "16" to "21" is set to 12.5 mm and the gap between the windings having the turn numbers "7" to "15" is set to 9 mm. In "dense 1", the length of the coil is 231 mm.

In the case of "dense 2", the gap between the windings having the turn numbers "1" to "4", "10" to "12" and "18" to "21" is set to 12.5 mm; the gap between the windings having the turn numbers "9" and "13" is set to 11.5 mm; and the gap between the turn numbers "5" to "8" and "14" to "17" is set to 9 mm. In "dense 2", the length of the coil is 233 mm.

In the case of "dense 3", the gap between the windings having the turn numbers "1", "2", "6" to "9", "13" to "16", "20" and "21" is set to 12.5 mm and the gap between the windings having the turn numbers "3" to "5", "10" to "12" and "17" to "19" is set to 9 mm. In "dense 3", the length of the coil is 231 mm.

In the case of "dense 4", the gap between the windings having the turn numbers "1", "2", "6", "7", "10" to "12", "15", "16", "20" and "21" is set to 12.5 mm; the gap between the windings having the turn numbers "5" and "17" is set to 11.5 mm; and the gap between the turn numbers "3", "4", "8", "9", "13", "14", "18" and "19" is set to 9 mm. In "dense 4", the length of the coil is 233 mm.

In the case of "dense 5", the gap between the windings having the turn numbers "1", "4", "5", "8" to "10", "12" to "14", "17", "18" and "21" is set to 12.5 mm and the gap between the windings having the turn numbers "2", "3", "6", "1", "11", "15", "16", "19" and "20" is set to 9 mm. In "dense 5", the length of the coil is 231 mm.

In the case of "dense 6", the gap between the windings having the turn numbers "1", "3", "4", "7", "8", "11", "14", "15", "18", "19" and "21" is set to 12.5 mm; the gap between the windings having the turn numbers "5", "10", "12" and "17" is set to 10 mm; and the gap between the turn numbers "2", "6", "9", "13", "16" and "20" is set to 9 mm. In "dense 6", the length of the coil is 232 mm.

In the case of "sparse 1", the gap between the windings having the turn numbers "1" to "6" and "16" to "21" is set to 9 mm; the gap between the windings having the turn numbers "7" to "9" and "13" to "15" is set to 13.5 mm; and the gap between the windings having the turns numbers "10" to "12" is set to 14.5 mm. In "sparse 1", the length of the coil is 233 mm.

In the case of "sparse 2", the gap between the windings having the turn numbers "1" to "4", "9" to "13" and "18" to "21" is set to 9 mm and the gap between the windings having the turn numbers "5" to "8" and "14" to "17" is set to 14.5 mm. In "sparse 2", the length of the coil is 233 mm.

In the case of "sparse 3", the gap between the windings having the turn numbers "1", "2", "6" to "9", "13" to "16", "20" and "21" is set to 9 mm; the gap between the windings having the turn numbers "3", "5", "10", "12", "17" and "19" is set to 13.5 mm; and the gap between the windings having the turns numbers "4", "11" and "18" is set to 14.5 mm. In "sparse 3", the length of the coil is 233 mm.

In the case of "sparse 4", the gap between the windings having the turn numbers "1", "2", "5" to "7", "10" and "12", "15" to "17", "20" and "21" is set to 9 mm and the gap between the windings having the turn numbers "3", "4", "8", "9", "13", "14", "18" and "19" is set to 14.5 mm. In "sparse 4", the length of the coil is 233 mm.

In the case of "sparse 5", the gap between the windings having the turn numbers "1", "4", "5", "8" to "10", "12" to "14", "17", "18" and "21" is set to 9 mm; the gap between the windings having the turn numbers "2", "3", "6", "7", "15", 16", "19" and "20" is set to 13.5 mm; and the gap between the windings having the turns number "11" is set to 14.5 mm. In "sparse 5", the length of the coil is 231 mm.

In the case of "sparse 6", the gap between the windings having the turn numbers "1", "3", "4", "7", "8", "10" to "12", "14", "15", "18", "19" and "21" is set to 9 mm and the gap between the windings having the turn numbers "2", "5", "6", "9", "12", "16", "17" and "10" is set to 14.5 mm. In "sparse 6", the length of the coil is 233 mm.

In the patterns of "dense 1" to "dense 6", one or a plurality of parallel resonance frequencies corresponding to the peak in the frequency-impedance characteristics is shifted to a higher frequency side, compared to the pattern of "standard". In the patterns of "sparse 1" to "sparse 6", one or a plurality of parallel resonance frequencies corresponding to the peak in the frequency-impedance characteristics is shifted to a lower frequency side, compared to the pattern of "standard".

Figure 7A:
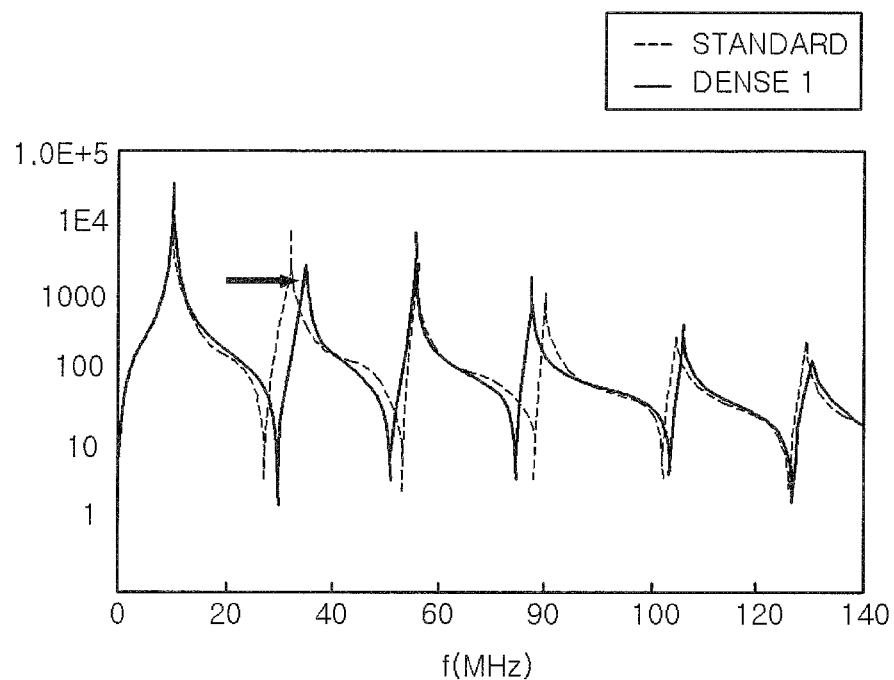
FIGS. 7A to 7F show examples of shift of a parallel resonance frequency in patterns of "dense 1" to "dense 6", respectively.

The shift of the parallel resonance frequency will be described. FIG. 7A shows an example of the shift of the parallel resonance frequency in the pattern of "dense 1". FIG. 7A shows the frequency-impedance characteristics of the filter 102(1) in the case where the winding gap of the air core coil 104(1) has a pattern of "dense 1". Further, FIG. 7A shows the frequency-impedance characteristics of the filter 102(1) in the case where the winding gap of the air core coil 104(1) has a pattern of "standard". In the filter 102(1), the frequency-impedance characteristics of the parallel multiple resonance in which impedance peaks occur in a pyramid shape at a regular frequency interval are obtained. Further, in the filter 102(1), one or a plurality of resonance frequencies is shifted by changing a part of the winding gaps of the air core coil 104(1). For example, in the pattern of "dense 1", the second resonance frequency indicated by the arrow is shifted to a higher frequency side, compared to the pattern of "standard".

Figure 7B:
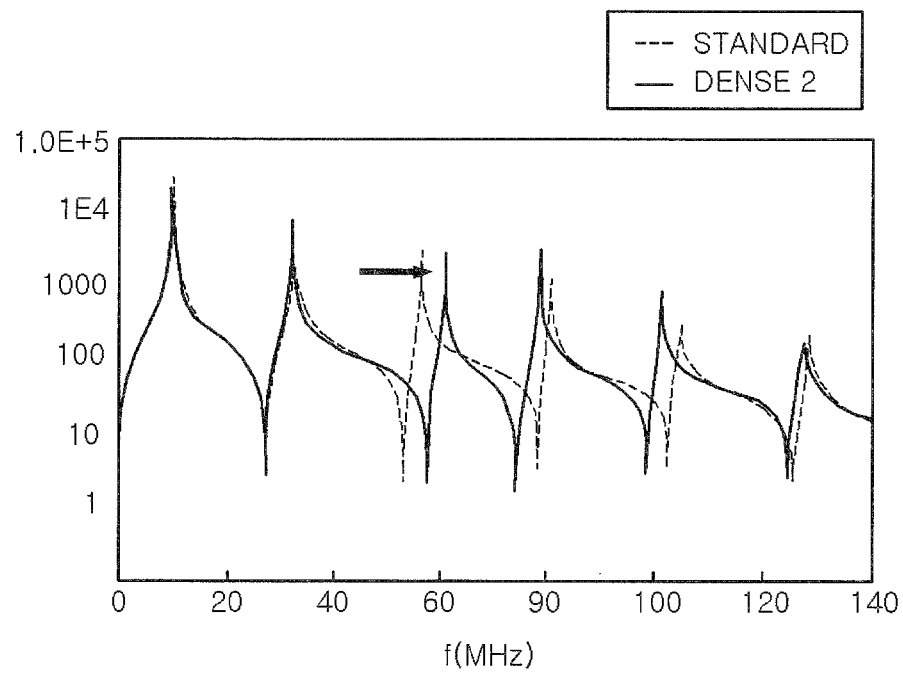

FIG. 7B shows an example of the shift of the parallel resonance frequency in the pattern of "dense 2". FIG. 7B shows the frequency-impedance characteristics of the filter 102(1) in the case where the winding gap of the air core coil 104(1) has a pattern of "dense 2". Further, FIG. 7B shows the frequency-impedance characteristics of the filter 102(1) in the case of the winding gap of the air core coil 104(1) having a pattern of "standard". In the filter 102(1), one or a plurality of resonance frequencies is shifted by changing a part of the winding gaps of the air core coil 104(1). For example, in the pattern of "dense 2", the third resonance frequency indicated by the arrow is shifted to a higher frequency side, compared to the pattern of "standard".

Figure 7C:
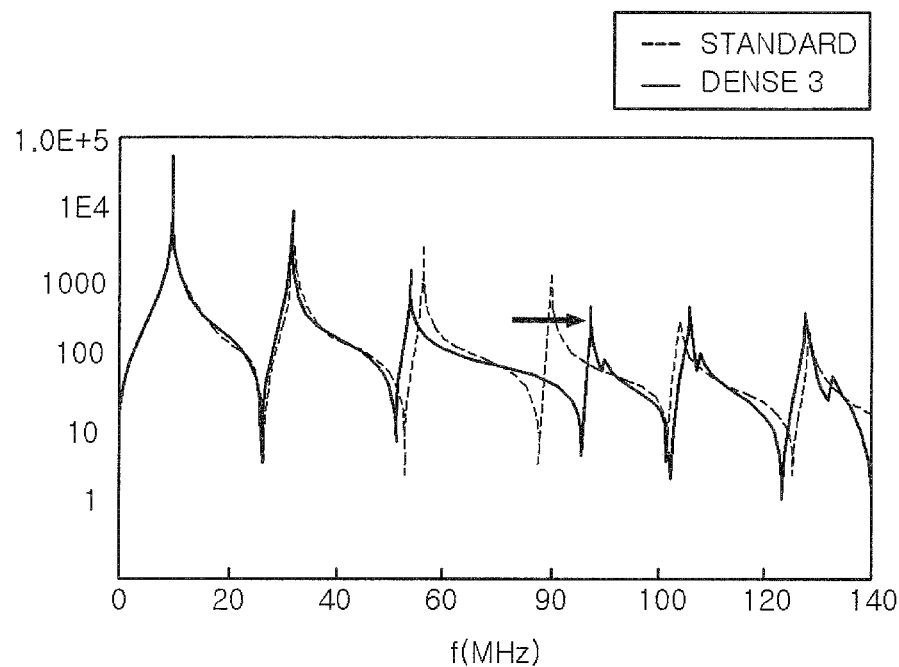

FIG. 7C shows an example of the shift of the parallel resonance frequency in the pattern of "dense 3". FIG. 7C shows the frequency-impedance characteristics of the filter 102(1) in the case where the winding gap of the air core coil 104(1) has a pattern of "dense 3". Further, FIG. 7C shows the frequency-impedance characteristics of the filter 102(1) in the case of the winding gap of the air core coil 104(1) having a pattern of "standard". In the filter 102(1), one or a plurality of resonance frequencies is shifted by changing a part of the winding gaps of the air core coil 104(1). For example, in the pattern of "dense 3", the fourth resonance frequency indicated by the arrow is shifted to a higher frequency side, compared to the pattern of "standard".

Figure 7D:
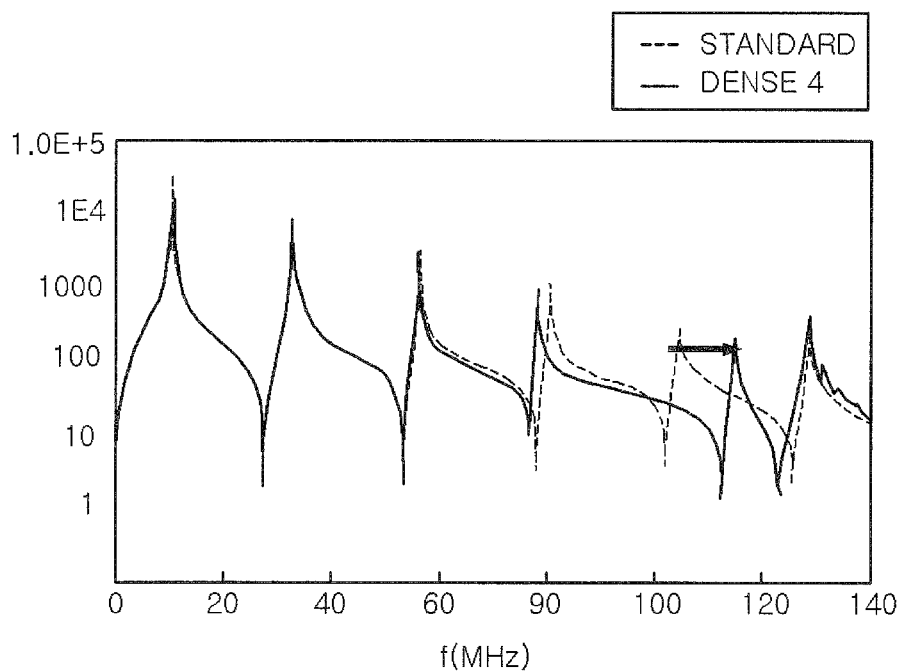

FIG. 7D shows an example of the shift of the parallel resonance frequency in the pattern of "dense 4". FIG. 7D shows the frequency-impedance characteristics of the filter 102(1) in the case where the winding gap of the air core coil 104(1) has a pattern of "dense 4". Further, FIG. 7D shows the frequency-impedance characteristics of the filter 102(1) in the case of the winding gap of the air core coil 104(1) having a pattern of "standard". In the filter 102(1), one or a plurality of resonance frequencies is shifted by changing a part of the winding gaps of the air core coil 104(1). For example, in the pattern of "dense 4", the fifth third resonance frequency indicated by the arrow is shifted to a higher frequency side, compared to the pattern of "standard".

Figure 7E:
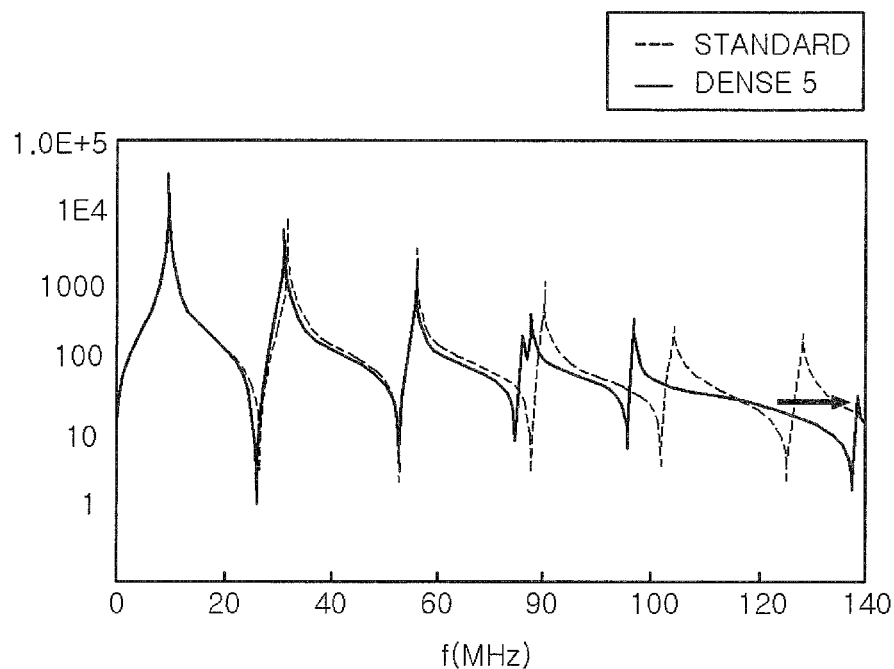

FIG. 7E shows an example of the shift of the parallel resonance frequency in the pattern of "dense 5". FIG. 7E shows the frequency-impedance characteristics of the filter 102(1) in the case where the winding gap of the air core coil 104(1) has a pattern of "dense 5". Further, FIG. 7E shows the frequency-impedance characteristics of the filter 102(1) in the case of the winding gap of the air core coil 104(1) having a pattern of "standard". In the filter 102(1), one or a plurality of resonance frequencies is shifted by changing a part of the winding gaps of the air core coil 104(1). For example, in the pattern of "dense 5", the sixth resonance frequency indicated by the arrow is shifted to a higher frequency side, compared to the pattern of "standard".

Figure 7F:
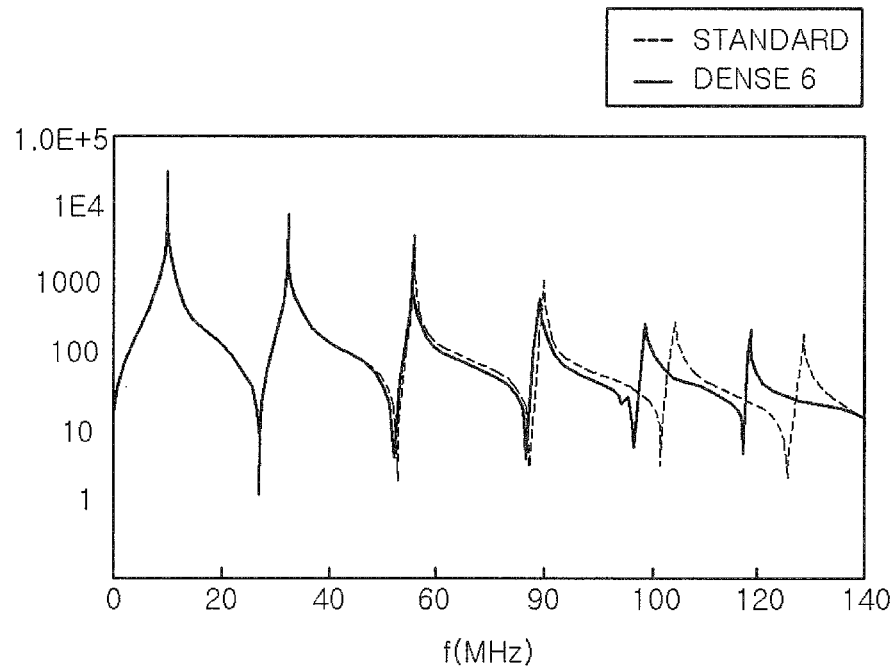

FIG. 7F shows an example of the shift of the parallel resonance frequency in the pattern of "dense 6". FIG. 7F shows the frequency-impedance characteristics of the filter 102(1) in the case where the winding gap of the air core coil 104(1) has a pattern of "dense 6". Further, FIG. 7F shows the frequency-impedance characteristics of the filter 102(1) in the case of the winding gap of the air core coil 104(1) having a pattern of "standard". In the filter 102(1), one or a plurality of resonance frequencies is shifted by changing a part of the winding gaps of the air core coil 104(1). For example, in the pattern of "dense 6", the seventh resonance frequency indicated by the arrow is shifted to a higher frequency side, compared to the pattern of "standard".

Figure 8A:
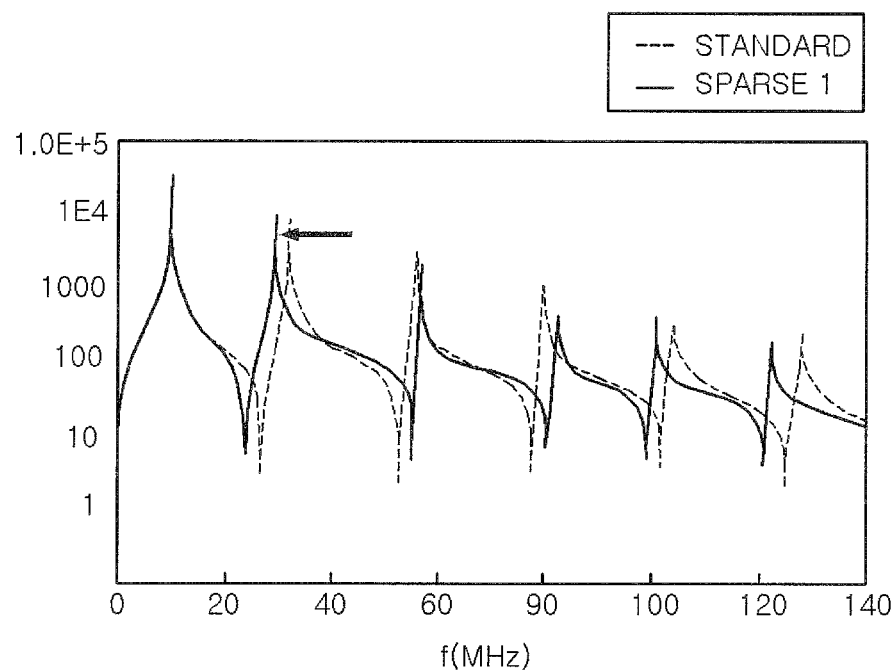
FIGS. 8A to 8F show examples of shift of a parallel resonance frequency in patterns of "sparse 1" to "sparse 6", respectively.

FIG. 8A shows an example of the shift of the parallel resonance frequency in the pattern of "sparse 1". FIG. 8A shows the frequency-impedance characteristics of the filter 102(1) in the case where the winding gap of the air core coil 104(1) has a pattern of "sparse 1". Further, FIG. 8A shows the frequency-impedance characteristics of the filter 102(1) in the case of the winding gap of the air core coil 104(1) having a pattern of "standard". In the filter 102(1), one or a plurality of resonance frequencies is shifted by changing a part of the winding gaps of the air core coil 104(1). For example, in the pattern of "sparse 1", the second resonance frequency indicated by the arrow is shifted to a lower frequency side, compared to the pattern of "standard".

Figure 8B:
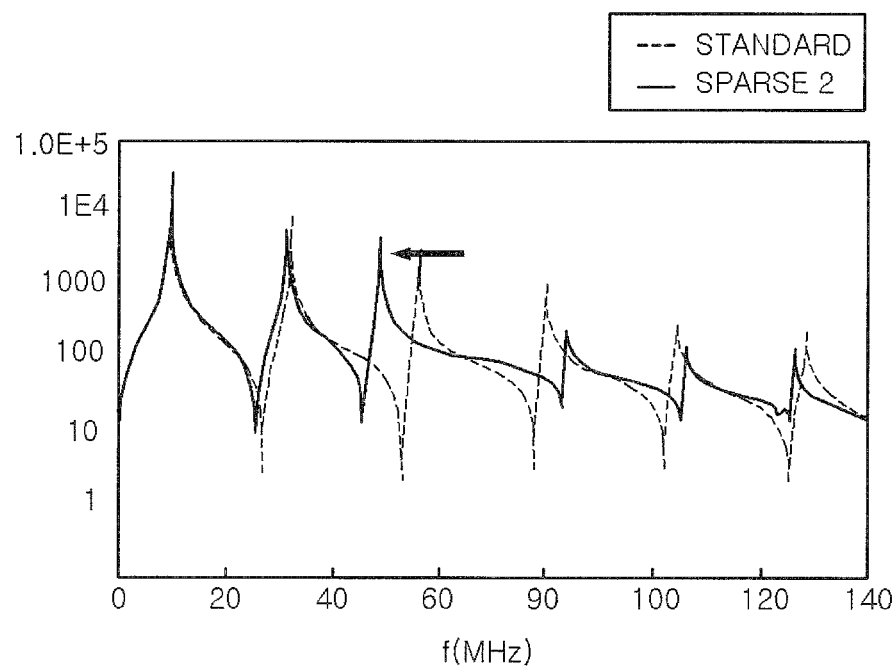

FIG. 8B shows an example of the shift of the parallel resonance frequency in the pattern of "sparse 2". FIG. 8B shows the frequency-impedance characteristics of the filter 102(1) in the case where the winding gap of the air core coil 104(1) has a pattern of "sparse 2". Further, FIG. 8B shows the frequency-impedance characteristics of the filter 102(1) in the case of the winding gap of the air core coil 104(1) having a pattern of "standard". In the filter 102(1), one or a plurality of resonance frequencies is shifted by changing a part of the winding gaps of the air core coil 104(1). For example, in the pattern of "sparse 1", the third resonance frequency indicated by the arrow is shifted to a lower frequency side, compared to the pattern of "standard".

Figure 8C:
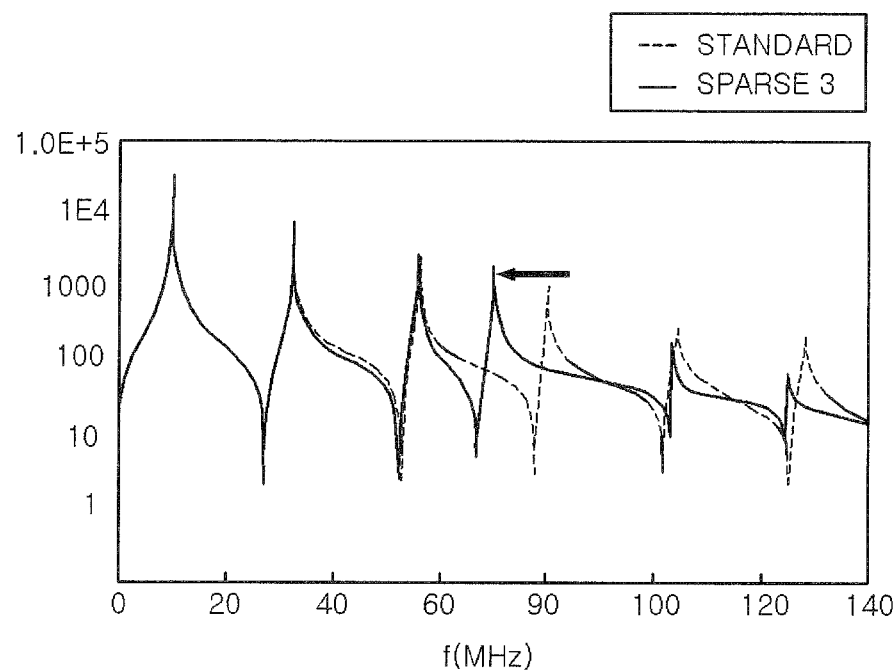

FIG. 8C shows an example of the shift of the parallel resonance frequency in the pattern of "sparse 3". FIG. 8C shows the frequency-impedance characteristics of the filter 102(1) in the case where winding gap of the air core coil 104(1) has a pattern of "sparse 3". Further, FIG. 8C shows the frequency-impedance characteristics of the filter 102(1) in the case of the winding gap of the air core coil 104(1) having a pattern of "standard". In the filter 102(1), one or a plurality of resonance frequencies is shifted by changing a part of the winding gaps of the air core coil 104(1). For example, in the pattern of "sparse 1", the fourth resonance frequency indicated by the arrow is shifted to a lower frequency side, compared to the pattern of "standard".

Figure 8D:
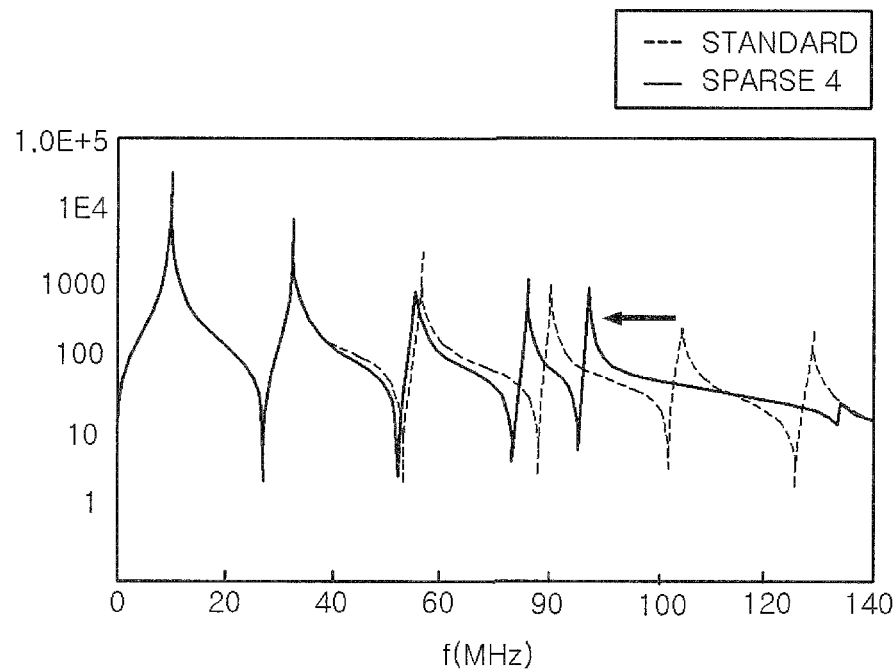

FIG. 8D shows an example of the shift of the parallel resonance frequency in the pattern of "sparse 4". FIG. 8D shows the frequency-impedance characteristics of the filter 102(1) in the case where winding gap of the air core coil 104(1) has a pattern of "sparse 4". Further, FIG. 8D shows the frequency-impedance characteristics of the filter 102(1) in the case of the winding gap of the air core coil 104(1) having a pattern of "standard". In the filter 102(1), one or a plurality of resonance frequencies is shifted by changing a part of the winding gaps of the air core coil 104(1). For example, in the pattern of "sparse 4", the fifth resonance frequency indicated by the arrow is shifted to a lower frequency side, compared to the pattern of "standard".

Figure 8E:
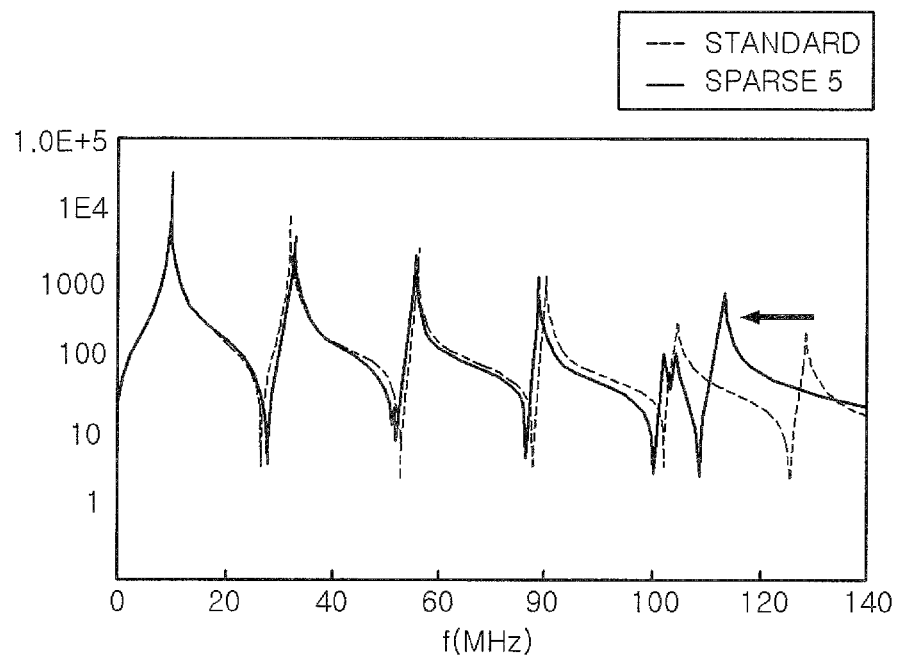

FIG. 8E shows an example of the shift of the parallel resonance frequency in the pattern of "sparse 5". FIG. 8E shows the frequency-impedance characteristics of the filter 102(1) in the case where the winding gap of the air core coil 104(1) has a pattern of "sparse 5". Further, FIG. 8E shows the frequency-impedance characteristics of the filter 102(1) in the case of the winding gap of the air core coil 104(1) having a pattern of "standard". In the filter 102(1), one or a plurality of resonance frequencies is shifted by changing a part of the winding gaps of the air core coil 104(1). For example, in the pattern of "sparse 5", the sixth resonance frequency indicated by the arrow is shifted to a lower frequency side, compared to the pattern of "standard".

Figure 8F:
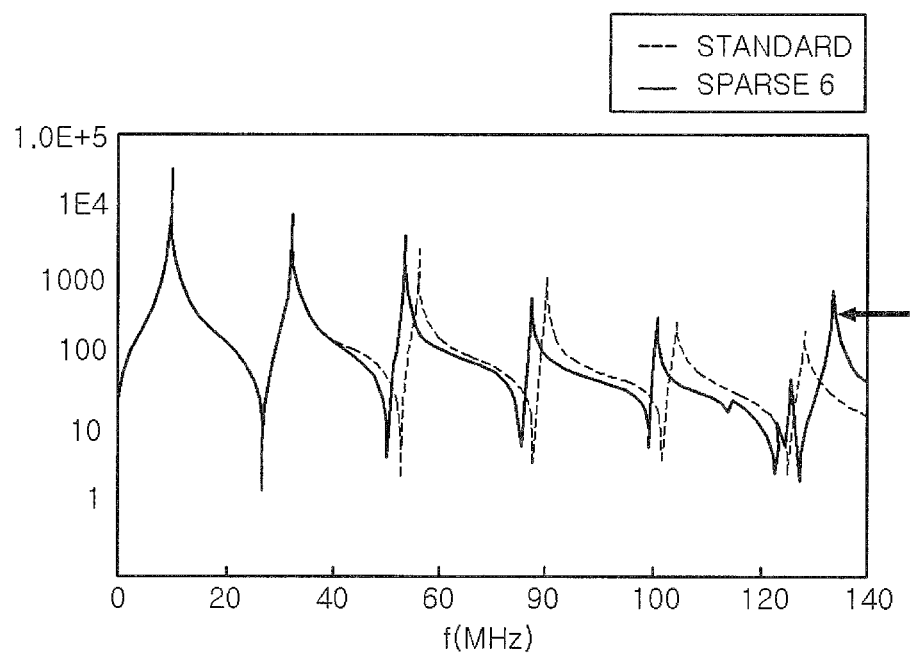

FIG. 8F shows an example of the shift of the parallel resonance frequency in the pattern of "sparse 6". FIG. 8F shows the frequency-impedance characteristics of the filter 102(1) in the case where the winding gap of the air core coil 104(1) has a pattern of "sparse 6". Further, FIG. 8F shows the frequency-impedance characteristics of the filter 102(1) in the case of the winding gap of the air core coil 104(1) having a pattern of "standard". In the filter 102(1), one or a plurality of resonance frequencies is shifted by changing a part of the winding gaps of the air core coil 104(1). For example, in the pattern of "sparse 1", the seventh resonance frequency indicated by the arrow is shifted to a lower frequency side, compared to the pattern of "standard".

In this manner, the air core coil 104(1) has effective sections for shifting a specific $N^{th}$ (N being a natural number) parallel resonance frequency. For example, the section in which the turn number of the air core coil 104(1) ranges from "7" to "15" is an effective section for shifting the second parallel resonance frequency to the higher side in the frequency-impedance characteristics. The effective section is changed depending on the number of windings of the air core coil 104(1), the coil length, and the like. In the air core coil, N number of effective sections exist for a specific $N^{th}$ (N being a natural number) parallel resonance frequency.

In the plasma processing apparatus 1, the frequency of noise varies depending on the type of the apparatus, the frequency of the high frequency power applied to the susceptor 12, and the like. However, in the plasma processing apparatus 1 of the present embodiment, the resonance frequency of the filter 102(1) can be shifted by changing the winding gap of the air core coil 104(1) by operating the movable member 120. Therefore, the noise can be attenuated or blocked by the filter 102(1) by shifting the resonance frequency to correspond to the frequency of the noise. Accordingly, the plasma processing apparatus 1 can reduce burden of reconstructing the filter 102(1) for different frequencies of the noise.

The plasma processing apparatus 1 may receive specified winding gaps of the air core coil 104(1) from the outside. For example, the plasma processing apparatus 1 receives the specified winding gaps of the air core coils 104(1) from the user interface 75B, and the process controller 75A may control the power unit 1202 for moving the movable member 120 so that the specified winding gaps are obtained. Further, for example, the plasma processing apparatus 1 stores the gap information indicating each winding gap of the air core coils 104(1) in the storage unit 75C. For example, the plasma processing apparatus 1 stores patterns such as "standard", "dense 1" to "dense 6", "sparse 1" to "sparse 6" shown in FIG. 6 as the gap information. The plasma processing apparatus 1 receives the specified pattern of the winding gap from the user interface 75B, and the process controller 75A may move the movable member 120 by controlling the power unit 1202 for moving the movable member 120 so that the winding gap of the specified pattern is obtained.

Further, the plasma processing apparatus 1 may automatically change each winding gap of the air core coil 104(1) so that the noise can be attenuated or blocked. The frequency of the noise generated in the power feed conductors 52(IN) and 52(OUT) varies depending on the type of the plasma processing apparatus 1, the frequency of the high frequency power applied to the susceptor 12, and the like, but the generated frequencies are determined in advance. The plasma processing apparatus 1 stores the gap information indicating each winding gap of the coil in which a parallel resonance frequency suitable for attenuating or blocking the noise is generated in association with the frequency of the noise or the frequency of the AC power applied to the susceptor 12.

For example, the plasma processing apparatus 1 stores, as the gap information, each winding gap of the air core coil 104(1) in association with the frequency of the noise or the combination of the frequencies of the high frequency powers from the first high frequency power supply 28 and the second high frequency power supply 30 which are applied to the susceptor 12. Each winding gap of the air core coils 104(1) may be stored as a pattern such as "standard", "dense 1" to "dense 6", "sparse 1" to "sparse 6" shown in FIG. 6.

The process controller 75A may move the movable member 120 by controlling the power unit 1202 for moving the movable member 120, based on the gap information, so that the winding gap corresponding to the frequency of the noise or the combination of frequencies of the high frequency powers applied to the susceptor 12 is obtained. The plasma processing apparatus 1 may obtain the frequency of the noise by actually measuring the noise generated in the power feed conductors 52 (IN) and 52(OUT).

Further, the plasma processing apparatus 1 may calculate the frequency of the noise from the frequency or the AC power applied to the susceptor 12 or the like. Moreover, the plasma processing apparatus 1 may store the frequency of the noise in advance in association with the frequency of the AC power applied to the susceptor 12 or the like. For example, the plasma processing apparatus 1 may store the frequency of the noise in the storage unit 75C for each combination of the frequencies of the high frequency powers of the first high-frequency power supply 28 and the second high-frequency power supply 30.

Further, the plasma processing apparatus 1 stores, in the storage unit 75C, timing information indicating timing at which the characteristics of the filter 102(1) are changed, e.g., timing at which the frequency of the AC power applied to the susceptor 12 is changed in the plasma processing or the like, and the gap information indicating each winding gap of the coil in response to the changed characteristics. The process controller 75A may move the movable member 120 by controlling the power unit 1202 for moving the movable member 120 based on the gap information at the change timing shown in the timing information.

As described above, the plasma processing apparatus 1 of the present embodiment can dynamically change the characteristics of the filter 102(1) for the noise, without reconstructing the filter 102(1), by moving the movable members 120. Accordingly, the plasma processing apparatus 1 can dynamically change the characteristics of the filter 102(1) for every plasma processing or during the plasma processing. For example, in plasma processing apparatus 1, the frequency of high frequency power applied to susceptor is changed and the frequency of the generated noise is changed during the plasma processing. Even in that case, the plasma processing apparatus 1 can change the characteristics of the filter 102(1) during the plasma processing such that the noise can be attenuated or blocked.

Effect

As described above, the plasma processing apparatus 1 of the present embodiment includes the heater power supplies 58(IN) and 58(OUT) electrically connected to the inner heating wire 40(IN) and the outer heating wire 40(OUT) in the chamber 10 where the plasma processing is performed. The plasma processing apparatus 1 attenuates or blocks the noise introduced into the heater power feed lines from the inner heating wire 40(IN) and the outer heating wire 40(OUT) toward the heater power supplies 58(IN) and 58(OUT) by the filters 102 provided on the respective heater power feed lines. The filter 102 includes the air core coil 104, the outer conductor 110, and the movable member 120. The air core coil 104 has a constant diameter and a constant coil length.

The outer conductor 110 has a tubular shape and accommodates or surrounds the air core coil 104. Further, the outer conductor 110 forms a distributed constant line in which parallel resonance occurs at multiple frequencies in combination with the air core coil 104. The movable member 120 is positioned in one or a plurality of effective sections where a specific one or a plurality of parallel resonance frequencies is shifted to a higher frequency side or a lower frequency side in the frequency-impedance characteristics of the filter 102, and each winding gap of the air core coils 104 is changed. Accordingly, the plasm processing apparatus 1 can reduce burden of reconstructing the filter for different frequencies of the noise.

In the plasma processing apparatus 1 of the present embodiment, the movable member 120 is provided for each turn of the winding of the air core coil 104 at different positions movable member in the circumferential direction of the winding with respect to the adjacent turns of the winding. Accordingly, in the plasma processing apparatus 1, when the movable member 120 is arranged for each turn of the winding of the air core coil 104, a wide arrangement space for the movable member 120 can be ensured in the axial direction of the air core coil 104.

Further, in the plasma processing apparatus 1 of the present embodiment, the movable members 120 are made of an insulating material. Therefore, the plasma processing apparatus 1 can suppress self-heating caused by the high frequency or the electric field disturbance around the air core coil 104.

Moreover, in the plasma processing apparatus 1 of the present embodiment, the movable members 120 are spaced apart from each other at a predetermined angle in the circumferential direction of the air core coil 104 for each turn of the air core coil 104, and the operation of changing the winding gap is performed in synchronization with each turn. Thus, the plasma processing apparatus 1 can change the winding gap for each turn.

Furthermore, in the plasma processing apparatus 1 of the present embodiment, two movable members 120 are spaced apart from each other at an angle of 180° in the circumferential direction of the air core coil 104 for each turn of the air core coil 104. Accordingly, the plasma processing apparatus 1 can precisely control the winding gap for each turn.

In the plasma processing apparatus 1 of the present embodiment, the power transmission unit 1201 for transmitting power to the movable members 120 is made of a ceramic-based material or a glass-based material. Therefore, the plasma processing apparatus 1 can suppress influence of the heat generation of the air core coil 104 and the self-induction heat on the positional accuracy.

In the plasma processing apparatus 1 of the present embodiment, the power unit 1202 capable of detecting positions of the movable members is connected to the movable members through a linear motion mechanism moving in the axial direction of the air core coil 104. Accordingly, the plasma processing apparatus 1 can operate the movable members 120 by the power unit 1202 and detect the position of the movable members 120.

The plasma processing apparatus 1 of the present embodiment stores in the storage unit 75C the gap information indicating each winding gap of the air core coil 104 in which the parallel resonance frequency suitable for attenuating or blocking the noise is generated in association with the frequency of the AC power applied in the plasma processing. In the plasma processing apparatus 1, the process controller 75A controls the movable members 120 based on the gap information stored in the storage unit 75C such that the winding gap corresponding to the frequency of the noise entering the line or the frequency of the AC power applied in the plasma process can be obtained. Accordingly, the plasma processing apparatus 1 can attenuate or block the noise even when the frequency of generated noise is changed.

Other Embodiments or Modifications

In the above embodiments, the case where the present disclosure is applied to a filter for a power supply line such as a heater power feed line or the like has been described as an example. However, the present disclosure is not limited to the filter described above, and may also be applied to a transmission circuit or any filter provided in a single line or a pair of lines connecting an electrical component provided in the chamber and an external circuit of a signal system or a power system provided outside the chamber.

Particularly, the plasma processing apparatus 1 of the present embodiment can perform left shift control or right shift control of the resonance frequency by providing the movable members 120 identical to those described above at other coils that require the control of the resonance frequency. For example, in the case of providing a filter for attenuating or blocking noise in the high frequency power supply line between the high frequency power supplies and 30 and the susceptor 12 in the chamber 10, the present disclosure may be applied to the corresponding filter. The present disclosure may also be applied to a matching circuit for matching an impedance between a high frequency power supply and a plasma load on a high frequency power supply line between the high frequency power supplies 28 and 30 and the susceptor 12 in the chamber 10.

In the above embodiments, the case where the movable member 120 is provided for each turn of the winding of the air core coil 104 has been described as an example. However, the present disclosure is not limited thereto, and the movable member 120 may be provided only for the turn of the winding within the effective section for a parallel resonance frequency to be shifted. Further, it is not necessary to provide the movable member 120 for each turn of the winding within the effective section. For example, the movable member 120 may be provided for the turns of the windings corresponding to both ends of the effective section. Accordingly, the number of movable members 120 arranged in the coil can be reduced.

The above embodiments are related to the filter for attenuating the noise of frequencies on a pair of power feed lines 100(1) and 100(2) electrically connecting the heating element 40 embedded in the susceptor 12 and the heater power supply 58 provided outside the chamber 10 in the capacitively coupled plasma etching apparatus of the lower side dual frequency application type in which the first high frequency power HF for plasma generation and the second high frequency power LF for ion attraction are superimposed and applied to the susceptor 12 in the chamber 10. However, the filter or the filter unit of the above embodiments may also be applied to the capacitively coupled plasma etching apparatus of the upper-and-lower dual frequency application type in which the first high frequency power HF for plasma generation is applied to the shower head 64 serving as the upper electrode and the second high frequency power LF for ion drawing is applied to the susceptor 12 or the capacitively coupled plasma etching apparatus of the lower side dual frequency application type in which a single high frequency is applied to the susceptor 12.

The present disclosure is not limited to a capacitively coupled plasma etching apparatus and may also be applied to a microwave plasma etching apparatus, an inductively coupled plasma etching apparatus, a helicon wave plasma etching apparatus, or the like. Further, the present disclosure may be applied to other plasm processing apparatuses for performing plasma CVD, plasma oxidation, plasma nitriding, sputtering or the like. The target substrate in the present disclosure is not limited to a semiconductor wafer, and it is also possible to use various substrates for a flat panel display, an organic EL, a solar cell or the like, a photomask, a CD substrate, a printed circuit board, or the like.

While the present disclosure has been shown and described with respect to the embodiments, it will be understood by those skilled in the art that various changes and modifications may be made without departing from the scope of the present disclosure as defined in the following claims.

What is claimed is:

1. A plasma processing apparatus comprising an external circuit disposed outside a processing chamber where plasma processing is performed and electrically connected through a line to an electrical component in the processing chamber and a filter provided on the line to attenuate or block noise introduced into the line from the electrical component toward the external circuit, the electrical component being a heating element that is provided in or around a high frequency electrode to which a high frequency power having a predetermined frequency is applied for the plasma processing or the electrical component being a high frequency electrode provided in a mounting table configured to support a target substrate, wherein the filter includes:
a coil having a constant diameter and a constant coil length, with an effective section being defined by at least one winding gap of the coil, and the winding gap being defined between two subsequent turns of winding of the coil;
a tubular outer conductor accommodating or surrounding the coil and forming a distributed constant line in which resonance occurs at multiple frequencies in combination with the coil; and
a movable member provided for each of the effective section, being provided with a power transmission unit configured to transmit power from a motor connected thereto to the movable member, and configured to change the winding gap by respectively moving the movable member using the power in a longitudinal direction of the coil, wherein at least one specific resonance frequency is shifted to a higher frequency side or a lower frequency side in frequency-impedance characteristics of the filter, due to the change of the winding gap.

2. The plasma processing apparatus of claim 1, wherein the movable member is provided for each turn of the winding within the effective section at different position in the circumferential direction of the winding with respect to the adjacent turns of the winding.

3. The plasma processing apparatus of claim 1, vs herein the movable member is made of an insulating material.

4. The plasma processing apparatus of claim 1, wherein the movable member includes a plurality of movable members spaced apart from each other at a predetermined angle in the circumferential direction of the winding for each turn of the winding within the effective section, and an operation of changing the winding gap is performed in synchronization with each turn.

5. The plasma processing apparatus of claim 4, wherein two movable members are spaced apart from each other at an angle of 180° or three movable members are spaced apart from each other at an angle of 120° in the circumferential direction of the winding for each turn of the winding within the effective section.

6. The plasma processing apparatus of claim 1, wherein the movable member is provided for each turn of the windings which correspond to both ends of the effective section.

7. The plasma processing apparatus of claim 1, wherein the power transmission unit is made of a ceramic-based material or a glass-based material.

8. The plasma processing apparatus of claim 1,
wherein the motor is connected to the movable member through a linear motion mechanism and configured to operate the movable member and detect position of the movable member.

9. The plasma processing apparatus of claim 1, further comprising
a memory storing gap information indicating each winding gap of the coil in which resonance frequency suitable for attenuating or blocking noise is generated in association with a frequency of the noise or a frequency of an AC power applied in the plasma processing; and
a controller configured to control the movable member, based on the gap information stored in the memory, so that the changed winding gap corresponds to the frequency of the noise introduced into the line or the frequency of the AC power applied in the plasma processing.

10. The plasma processing apparatus of claim 1, wherein in the coil, N effective sections exist for a specific $N^{th}$ resonance frequency, N being a natural number.

11. The plasma processing apparatus of claim 1, % herein the electrical component is the heating element,
the external circuit is a heater power supply configured to supply heat generating power to the heating element, and
the line is a power feed line electrically connecting t heater power supply and the heating element.

12. The plasma processing apparatus of claim 1, wherein the electrical component is the high frequency electrode provided in a mounting table configured to support a target substrate,
the external circuit includes a high frequency power supply configured to supply a high frequency power used for the plasma processing to the high frequency electrode, and
a matching circuit configured to match an impedance between the high frequency power supply and a plasma load is provided on the line.

* * * * *

UNITED STATES PATENT AND TRADEMARK OFFICE
CERTIFICATE OF CORRECTION

PATENT NO. : 11,011,347 B2
APPLICATION NO. : 16/012959
DATED : May 18, 2021
INVENTOR(S) : Hayashi et al.

It is certified that error appears in the above-identified patent and that said Letters Patent is hereby corrected as shown below:

In the Claims

Column 18, Claim 3, Line 46, "vs herein" should be -- wherein --.

Column 20, Claim 11, Line 1, "% herein" should be -- wherein --.

Column 20, Claim 11, Line 6, "connecting t" should be -- connecting the --.

Signed and Sealed this
Twentieth Day of July, 2021

Drew Hirshfeld
*Performing the Functions and Duties of the*
*Under Secretary of Commerce for Intellectual Property and*
*Director of the United States Patent and Trademark Office*